United States Patent [19]
Denisco et al.

[11] Patent Number: 5,406,504
[45] Date of Patent: Apr. 11, 1995

[54] MULTIPROCESSOR CACHE EXAMINER AND COHERENCY CHECKER

[75] Inventors: John A. Denisco, Malden; Arthur J. Beaverson, Boxborough, both of Mass.

[73] Assignee: Digital Equipment Corp., Maynard, Mass.

[21] Appl. No.: 85,869

[22] Filed: Jun. 30, 1993

[51] Int. Cl.⁶ .................. G05B 19/02; G06F 13/00
[52] U.S. Cl. .................... 364/580; 364/578; 364/400; 395/375; 395/400; 395/425
[58] Field of Search ........... 364/580, 578, 400, 926.92, 364/228.1; 395/375, 400, 425, 800

[56] References Cited

U.S. PATENT DOCUMENTS

| | | | |
|---|---|---|---|
| 4,928,225 | 5/1990 | McCarthy et al. | 395/425 |
| 5,029,070 | 7/1991 | McCarthy et al. | 395/425 |
| 5,123,095 | 6/1992 | Papadopoulos et al. | 395/375 |
| 5,125,083 | 6/1992 | Fite et al. | 395/375 |
| 5,155,843 | 10/1992 | Stamm et al. | 395/575 |
| 5,193,167 | 3/1993 | Sites et al. | 364/DIG. 1 |
| 5,239,654 | 8/1993 | Ing-Simmons et al. | 395/800 |
| 5,291,442 | 3/1994 | Emma et al. | 395/400 |
| 5,297,265 | 3/1994 | Frank et al. | 395/400 |

*Primary Examiner*—Emanuel T. Voeltz
*Assistant Examiner*—Alan Tran
*Attorney, Agent, or Firm*—Arthur W. Fisher; Denis G. Maloney; Lindsay G. McGuinness

[57] ABSTRACT

An arrangement for a multiprocessor RISC system enables each CPU of the system to test the control logic of its cache by indirectly examining states of the caches and comparing those states to predetermined valid cache states of the system. The arrangement includes a plurality of processes configured to acquire information from selected block entries of the caches. The information is then compared with an array of predetermined valid cache states contained in a state table to detect invalid cache states. A cache examining protocol defines the operational procedures followed by the processes when acquiring and examining the information.

6 Claims, 7 Drawing Sheets

300

| CACHE 20m | | | | | CACHE 20s | | | | | cc 312 | te 314 |
|---|---|---|---|---|---|---|---|---|---|---|---|
| h 302 | s 304 | v 306 | d 308 | cm 310 | h 302 | s 304 | v 306 | d 308 | cm 310 | | |
| 0 | 0 | 0 | 0 | X | 0 | 0 | 0 | 0 | X | X | X |
| 0 | 0 | 0 | 0 | X | 1 | 0 | 1 | 0 | 1 | X | X |
| 0 | 0 | 0 | 0 | X | 1 | 0 | 1 | 1 | X | X | X |
| 0 | 0 | 0 | 0 | X | 1 | 1 | 1 | 0 | 1 | X | X |
| 0 | 0 | 0 | 0 | X | 1 | 1 | 1 | 1 | X | X | X |
| 1 | 0 | 1 | 0 | 1 | 0 | 0 | 0 | 0 | X | X | X |
| 1 | 0 | 1 | 0 | 1 | 1 | 0 | 1 | 0 | 1 | X | 0 |
| 1 | 0 | 1 | 0 | 1 | 1 | 0 | 1 | 1 | X | X | 0 |
| 1 | 0 | 1 | 0 | 1 | 1 | 1 | 1 | 0 | 1 | X | 0 |
| 1 | 0 | 1 | 0 | 1 | 1 | 1 | 1 | 1 | X | X | 0 |
| 1 | 0 | 1 | 1 | X | 0 | 0 | 0 | 0 | X | X | X |
| 1 | 0 | 1 | 1 | X | 1 | 0 | 1 | 0 | 1 | X | 0 |
| 1 | 0 | 1 | 1 | X | 1 | 0 | 1 | 1 | X | X | 0 |
| 1 | 0 | 1 | 1 | X | 1 | 1 | 1 | 0 | 1 | X | 0 |
| 1 | 0 | 1 | 1 | X | 1 | 1 | 1 | 1 | X | X | 0 |
| 1 | 1 | 1 | 0 | 1 | 0 | 0 | 0 | 0 | X | X | X |
| 1 | 1 | 1 | 0 | 1 | 1 | 0 | 1 | 0 | 1 | X | 0 |
| 1 | 1 | 1 | 0 | 1 | 1 | 0 | 1 | 1 | X | X | 0 |
| 1 | 1 | 1 | 0 | 1 | 1 | 1 | 1 | 0 | 1 | 1 | 0 |
| 1 | 1 | 1 | 0 | 1 | 1 | 1 | 0 | 1 | X | 0 |
| 1 | 1 | 1 | 0 | 1 | 1 | 1 | 1 | 1 | X | 1 | 0 |
| 1 | 1 | 1 | 0 | 1 | 1 | 1 | 1 | 1 | X | X | 0 |
| 1 | 1 | 1 | 1 | X | 0 | 0 | 0 | 0 | X | X | X |
| 1 | 1 | 1 | 1 | X | 1 | 0 | 1 | 0 | 1 | X | 0 |
| 1 | 1 | 1 | 1 | X | 1 | 0 | 1 | 1 | X | X | 0 |
| 1 | 1 | 1 | 1 | X | 1 | 1 | 1 | 0 | 1 | 1 | 0 |
| 1 | 1 | 1 | 1 | X | 1 | 1 | 1 | 0 | 1 | X | 0 |
| 1 | 1 | 1 | 1 | 1 | 1 | 1 | 1 | 1 | 1 | 1 | 1 |

NOTE: "1" = SET
"0" = NOT SET
"X" = DON'T CARE

FIG. 3

MULTIPROCESSOR CACHE EXAMINER AND COHERENCY CHECKER

FIELD OF THE INVENTION

This invention relates generally to testing of multiprocessor computer systems and, more specifically, to a cache examiner and coherency checker for a multiprocessor computer system.

BACKGROUND OF THE INVENTION

A typical multiprocessing computer system comprises two or more central processing units (CPUs), a memory unit (main memory), and an input/output (I/O) unit. The main memory stores information, i.e., data and instructions for processing the data, in addressable storage locations. The information is transferred between the main memory and the CPUs along a bus which carries, inter alia, memory access request signals specifying the direction of transfer.

The information transferred between the CPUs and main memory must conform to certain timing relationships that exist between the memory access request signals and the information on the bus. If the CPUs operate at a fast clock signal frequency and the response time of the main memory is slow as compared to the frequency of the clock signal, the CPUs must enter wait states until the requests are completed, thereby affecting their processing rates. This is especially true for highly pipelined CPUs, such as those that are used in many reduced instruction set computers (RISCs).

A goal of RISC computer design is architectural simplicity and efficient pipelining to achieve a high-speed execution rate of instruction requests. Main memory is typically not fast enough to execute memory access requests as needed by the RISC CPUs. High-speed cache memories are used in these situations to compensate for the time differential between the memory access time and the CPU clocking frequencies. The access time of a cache is closer to the operational speed of the CPU and thus increases the speed of data processing by providing information to the CPU at a rapid rate.

A cache memory is typically organized into blocks, each of which is capable of storing a predetermined amount of information. Specifically, each block contains the data and instructions needed by the CPU, along with control flags indicating, inter alia, the status of those data and instructions. When a CPU requires information, the cache is initially examined. If the information is not found in the cache, the main memory is accessed. A block mode read request is then issued by the CPU to transfer a block of information including the required information from the main memory to the cache. The information is retrieved from main memory and loaded into a cache block, and the cache block is assigned a cache address. The cache address includes an "index" field and a "tag" field, which correspond to address fields of the location in main memory from which the information was retrieved.

Because a program may run on any CPU in a multiprocessor system, copies of the same information may reside in more than one place in the system. For example, copies of the same information may reside in each CPU's cache and in the main memory unit. If a CPU modifies a copy of that information without updating the remaining copies, those remaining copies of information become stale, thus creating a cache-coherency problem.

The prior art includes many solutions for the cache-coherency problem. These solutions are typically based upon the "states" of the control flags associated with the information contained in the cache. For example, the control flags may include a hit flag that indicates whether a "cache-hit" occured during a particular cache access, a valid flag that indicates whether the information contained in a cache block is valid, a dirty flag that indicates whether the valid cache block has been modified from the information stored in the corresponding location in main memory while in the cache, and a shared flag that indicates whether the valid information contained in the block is also stored in the cache of another CPU.

Cache control logic is typically used to examine the states of these control flags and perform appropriate operations in accordance with a particular cache-coherency protocol. During design verification stage of product development, this control logic must be tested to ensure that it is operating properly. A general-purpose CPU is typically programmed to test the control logic by directly examining the control flags and data in the cache under certain conditions and comparing their states with the results obtained by the control logic under the same conditions. However, the architectural simplicity of RISC CPUs generally preclude their direct interrogation of the cache control flags and data.

Therefore, it is among the objects of the invention to provide an arrangement by which CPUs of a multiprocessor RISC system can verify the operation of cache control logic by indirectly examining the states of their caches.

Another of object of the invention is to provide a method by which CPUs of a multiprocessor RISC system can efficiently detect invalid cache states in the system.

SUMMARY OF THE INVENTION

The invention resides in an arrangement by which CPUs of a multiprocessor RISC system may test the control logic of their caches by indirectly examining states of the caches and comparing those states to predetermined valid cache states of the system. The arrangement includes a plurality of processes configured to acquire information from selected block entries of the caches. The information is then compared with an array of predetermined valid cache states contained in a state table to detect invalid cache states. A cache examining protocol defines the operational procedures followed by the processes when acquiring and examining the information.

Specifically, a master process, running on a selected CPU of the system, and at least one slave process, running on an associated remaining CPU, implement the protocol to acquire information from the selected blocks of their caches and from corresponding locations in main memory. The information, which includes data, addresses and control flags, is stored in a common data structure in main memory and is thereafter utilized by a coherency checker when performing a system-wide, cache coherency examination.

In an exemplary embodiment of the invention, the master process acquires all the information needed by the coherency checker. This function is accomplished, in part, by synchronizing with the slave process. The master/slave configuration facilitates synchronization between the processes to ensure that the information is obtained without changing the contents of the caches. Once all the information is obtained and is stored in the common data structure, the data and address portions of the information are examined to generate additional control flags. These latter flags are appended to the existing control flags to form "cache state" information for a selected cache block entry.

The master process then calls the coherency checker, i.e., a schedulable process, to perform the cache coherency examination using a bit vector and a bit index. The bit vector is a condensed "token" of valid and invalid cache states in the system that is generated using the contents of the state table. The bit index is a value that is derived from the cache state information stored in the common data structure. The coherency checker uses the bit index as a pointer to a position of the bit vector. The value of that position is then tested to detect the state of the selected cache block entry, thereby providing an efficient means for detecting invalid cache states in a multiprocessor RISC system.

BRIEF DESCRIPTION OF THE DRAWINGS

The above and further advantages of the invention may be better understood by referring to the following description in conjunction with the accompanying drawings, in which:

FIG. 3 is a diagram of a state table containing an array of valid cache states, the combination of which includes states of control store flags and cache-memory flags;

DETAILED DESCRIPTION OF ILLUSTRATIVE EMBODIMENTS

Figure 1:
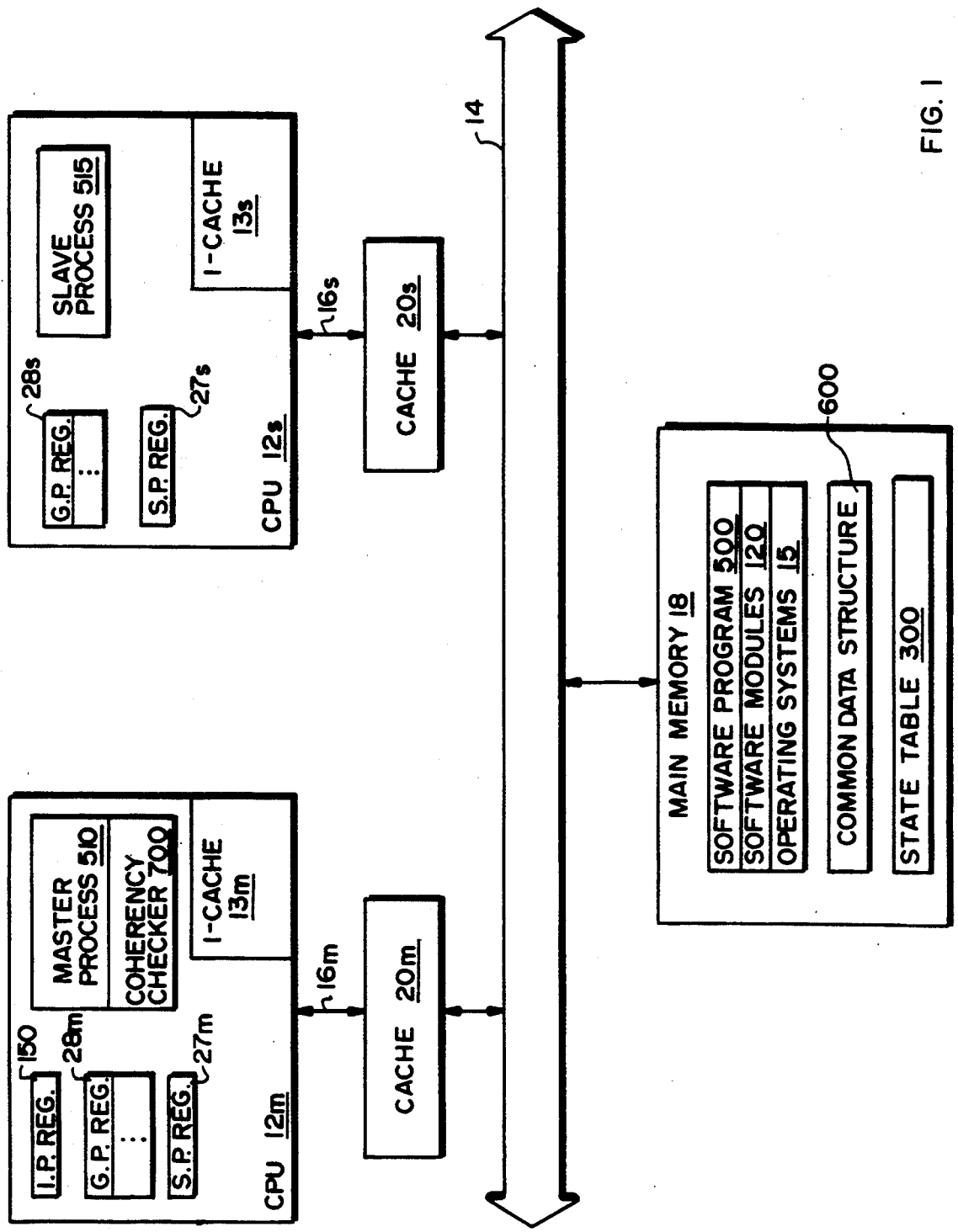
FIG. 1 is a diagram of portions of a multiprocessor computer system relevant to the invention including a plurality of central processing units (CPUs) and associated caches.

Referring now to the drawings and particularly to FIG. 1, portions of a multiprocessor computer system 10 relevant to the invention include a plurality of CPUs 12m,s coupled to associated B-cache memories, i.e., caches 20m,s, and a main memory unit 18 interconnected by a system bus 14. The system bus 14 provides a communication path for the transfer of information to and from the CPUs 12 and main memory 18. However, since the operational speeds of CPUs 12 are fast as compared to the information access time of main memory 18, CPUs 12 usually obtain needed data and instructions from their caches 20 over private CPU buses 16m,s.

The CPUs 12 are preferably reduced instruction set computer (RISC) chips having a load/store architecture that facilitates, inter alia, speed and multiple instruction issue. Accordingly, each CPU 12 has a plurality of special-purpose registers 27 and general-purpose registers 28, and an on-chip, first-level cache for storing only instructions. These first-level caches, i.e., the I-caches 13, are designed smaller than the associated off-chip, caches 20 so that they may more closely match the fast clock frequencies of the CPUs 12.

An operating system 15, portions of which are typically resident in main memory 18 and executed by the CPUs 12, functionally organizes the computer 10. The operating system 15 also includes, inter alia, software modules 120 executed by the CPUs 12 when invoking operations in support of software programs 500 running on the computer 10. Instances of the programs 500 executing on the CPUs 12 are called "processes", i.e., individually schedulable entities consisting of code and data. The operating system 15 organizes the computer 10 by tracking, suspending and resuming execution of these processes, while allocating to them the CPUs 12 and other system resources.

In accordance with the invention, a master process 510 and coherency checker process 700, each running on a "master" CPU 12m, and a slave process 515, running on a "slave" CPU 12s, are used to acquire information from their respective caches 20m,s and examine that information during a system-wide, cache coherency examination, as described below. It is to be understood that the CPUs 12m,s perform the operations needed to acquire and examine the information on behalf of the processes.

Each cache 20 is a high-speed memory located close to a CPU 12 that temporarily stores most recently used data and instructions. The cache 20 is designed to limit the number of address comparisons required to access the information it stores, while also limiting the number of write requests to main memory 18 when the desired information is present in the cache 20. Accordingly, the cache 20 is preferably organized as a write-back, direct-mapped cache, although it will be apparent to those skilled in the art that other cache design techniques could be used within the teachings of the invention.

Figure 2:
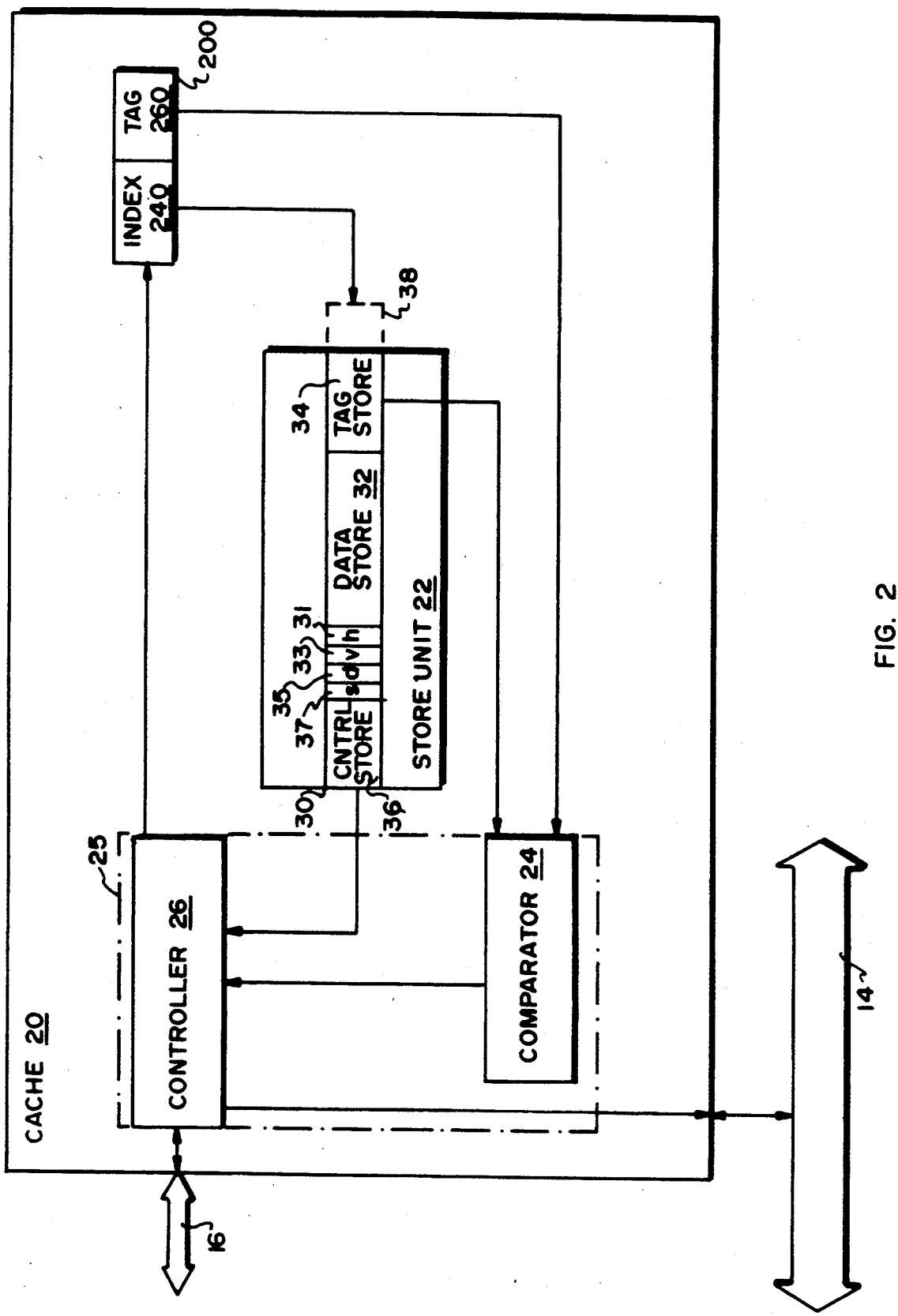
FIG. 2 is a diagram of a cache including control logic for determining the status of information present in the cache.

FIG. 2 is a diagram of the cache 20, which typically includes a store unit 22 and control logic 25 comprising a comparator 24 and a cache controller 26. The store unit 22 is divided into a plurality of block entries 30 that are configured to store a predetermined amount of information. Each block entry 30 includes a data store 32, a tag store 34 and a control store 36. The data store 32 may contain either the actual data or instructions needed by the CPU 12. The tag store 34 contains high order address bits of the location in main memory 18 that currently resides in the cache entry.

The control logic 25 determines the status of information present in the cache 20. Specifically, the comparator 24 compares an address issued by CPU 12 to the tag store 34 of a block 30 to determine whether the information desired by CPU 12 is located in cache 20. The controller 26 controls the internal operations of the cache 20 including, inter alia, examination of the control store 26 to determine the status of the information in the cache 20.

Because a program may run on any CPU 12 in the multiprocessor system 10, copies of the same information may reside in more than one cache 20 in the system. The control store 36 contains binary bits, i.e., flags, that are used to avoid the possibility of stale data residing in a cache 20. Specifically, the flags are associated with each cache block entry 30 to indicate whether the block is present in the cache (h-bit 31) and whether the contents of the block are valid (v-flag 33), dirty (d-flag 35) and/or shared (s-flag 37). Since the cache memory 20 is preferably organized as a direct-mapped cache, each block 30 has only one place where it can appear in the store unit 22, with that unique place being identified by an index location 38.

Operationally, when a CPU 12 requires information, the cache 20 is first examined. The CPU 12 sends an address 200 to the cache controller 26. The address 200 is divided into two fields to find a block of information in cache 20: an index field 240 and a tag field 260. The index field 240 and tag field 260 correspond to the location in main memory 18 from which the information stored in cache 20 was retrieved; that is, the index field 240 corresponds to a row address portion of the main memory location, while the tag field 260 corresponds to a column address portion of the memory location.

The index field 240 of the address 200 is used to select the location of the block 30 in store unit 22 desired by CPU 12. Once located, the tag store 34 of block 30 and the tag field 260 are presented to comparator 24 to determine whether the tags match. If the address tags match, a "cache hit" occurs and if the tags do not match, a "cache miss" results. In either case, the control store 36 of block 30 is examined by the controller 26 to determine the status of the information located in the data store 32. Specifically, if the h-flag 31 is set, the information is present in the cache 20, i.e., a "cache-hit"; if the v-flag 33 is set, the information in the data store 32 is valid; if the d-flag 35 is set, the information presently stored in the block 30 is dirty, that is, it has previously been changed from the information stored in the corresponding location in main memory 18; and if the s-flag 37 is set, the information contained in the block is also stored in the cache of another CPU.

It is apparent that the cache control logic 25 must be functional if the caches 20 are to operate properly. This control logic is typically tested during design verification by a CPU that is programmed to directly examine the flags of the control store 36 and compare their states with the results obtained by the control logic. However, the architectural simplicity of RISC CPUs generally preclude their direct interrogation of the cache control flags. Accordingly, the invention provides a testing arrangement that allows RISC CPUs to indirectly examine the contents of their caches to detect invalid cache states.

In general, the arrangement periodically examines the states of portions of the caches 20 and main memory 18 to determine whether the system 10 is operating correctly. A state table 300, shown in FIG. 3, resides in main memory 18 and contains an array of predetermined valid cache states for each cache 20 of the system, e.g., cache 20m and cache 20s. The contents of the table 300 are generated during design verification of the system and include combinations of states for the control store flags, designated herein as the h-flag 302, the s-flag 304, the v-flag 306, the d-flag 308, and other cache-memory related flags. Examples of the latter flags include a cm-flag 310 indicating whether the contents of a cache location and its associated memory location are equal during that cache access, a cc-flag 312, which indicates whether the contents of certain cache blocks from caches 20m,s are equal, and a te-flag 314, indicating whether the values of the tags of caches 20m,s are equal for the certain cache blocks.

Referring again to FIG. 1, the testing arrangement comprises a novel, cache examining protocol implemented by the master process 510 of software program 500 (FIG. 1), configured to run on CPU 12m of the system, and at least one slave process 515, configured to run on the slave CPU 12s. A master/slave configuration is utilized to facilitate synchronization between the processes when acquiring the information from their caches and from the shared main memory 18.

The arrangement also includes a coherency checker 700 and a common data structure 600 for storing the information acquired by the processes. The coherency checker 700 is preferably executed by the master CPU 12m when testing for system-wide cache coherency in accordance with the invention. Generally, the master process 510 develops a bit vector from the state table 300 and the coherency checker 700 derives a bit index from the information stored in the common data structure 600. The bit index is used to index into the bit vector and compare state values, as described below.

Figure 4A:
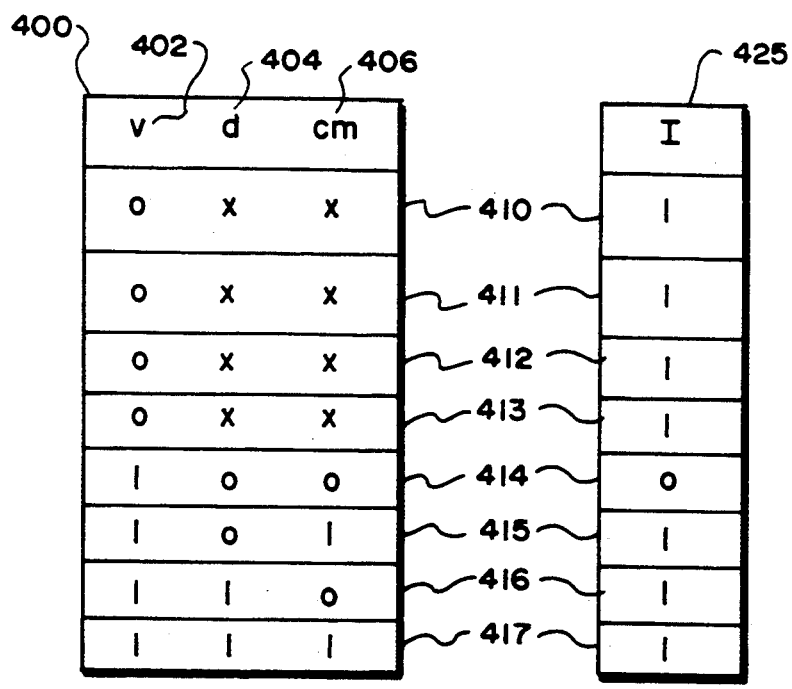
FIGS. 4A–B depict the creation of a bit vector from the contents of a simplified state table.
Figure 4B:
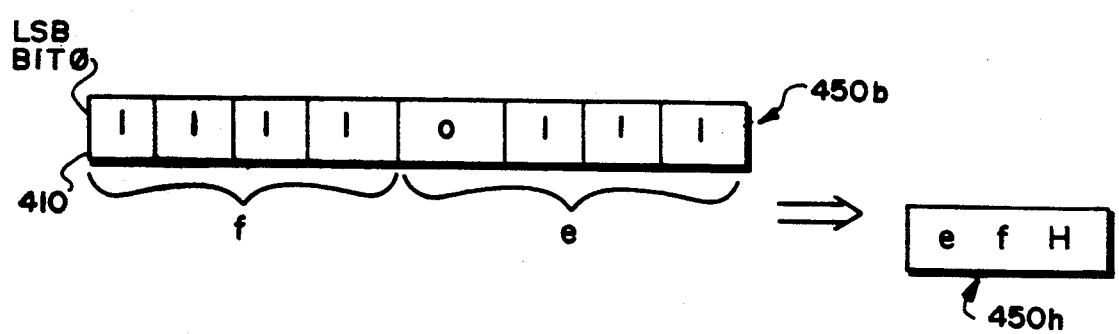

FIGS. 4A–B depict the creation of the bit vector from the contents of the state table. A simplified state table 400 is used for ease of depiction and ease of description, and thus includes only three (3) flags: the v-flag 402, the d-flag 404 and the cm-flag 406.

Referring to FIG. 4A, the contents of the table 400 contains all possible combinations of the flags, i.e., a total of eight (8) possible combination entries, labelled 410–417. Each entry represents a cache state of the system. However, these entries include both valid and invalid states. During design verification stage of the system 10, the state table is modified as the state of each entry is analyzed. For example, if the v-flag 402 is not set, i.e., "0", indicating that a cache block is invalid, then the states of the d-flag and cm-flag, in entries 410–413, "do not matter"; accordingly, an "x" may replace the states of these latter flags.

In addition, invalid cache state entries are detected during this stage. The entry "1 0 0" (at 414) is not a valid state because if a cache block is valid (v-flag="1") and not dirty (d-flag="0"), the cache and memory must be equal (cm-flag="1").

An index I-bit 425 may be added to the table 400 which, when set, denotes a valid "index" entry. Thus, each valid entry of the eight possible combination entries 410–417 has the I-bit set. The vertical I-bit column may then be rotated horizontally, as shown in FIG. 4B, and interpreted as a vector quantity, with the bit position at 410 being the least significant bit "0". The resulting bit vector may be represented in either binary notation 450b or hexidecimal notation 450h as efH.

Referring again to FIG. 1, the master and slave processes are schedulable entities consisting of software routines used to acquire data. Specifically, the master process 510 is responsible for acquiring all the information needed by the coherency checker 700. In order to accomplish this function, the master process 510 performs operations relative to the cache 20m associated with its CPU 12m, while synchronizing with the slave process 515 so that it may perform similar operations with respect to its cache 20s. The cache examining protocol defines the operational procedures followed by these processes when obtaining the information to ensure that the contents of the caches are not altered.

Figure 5A:
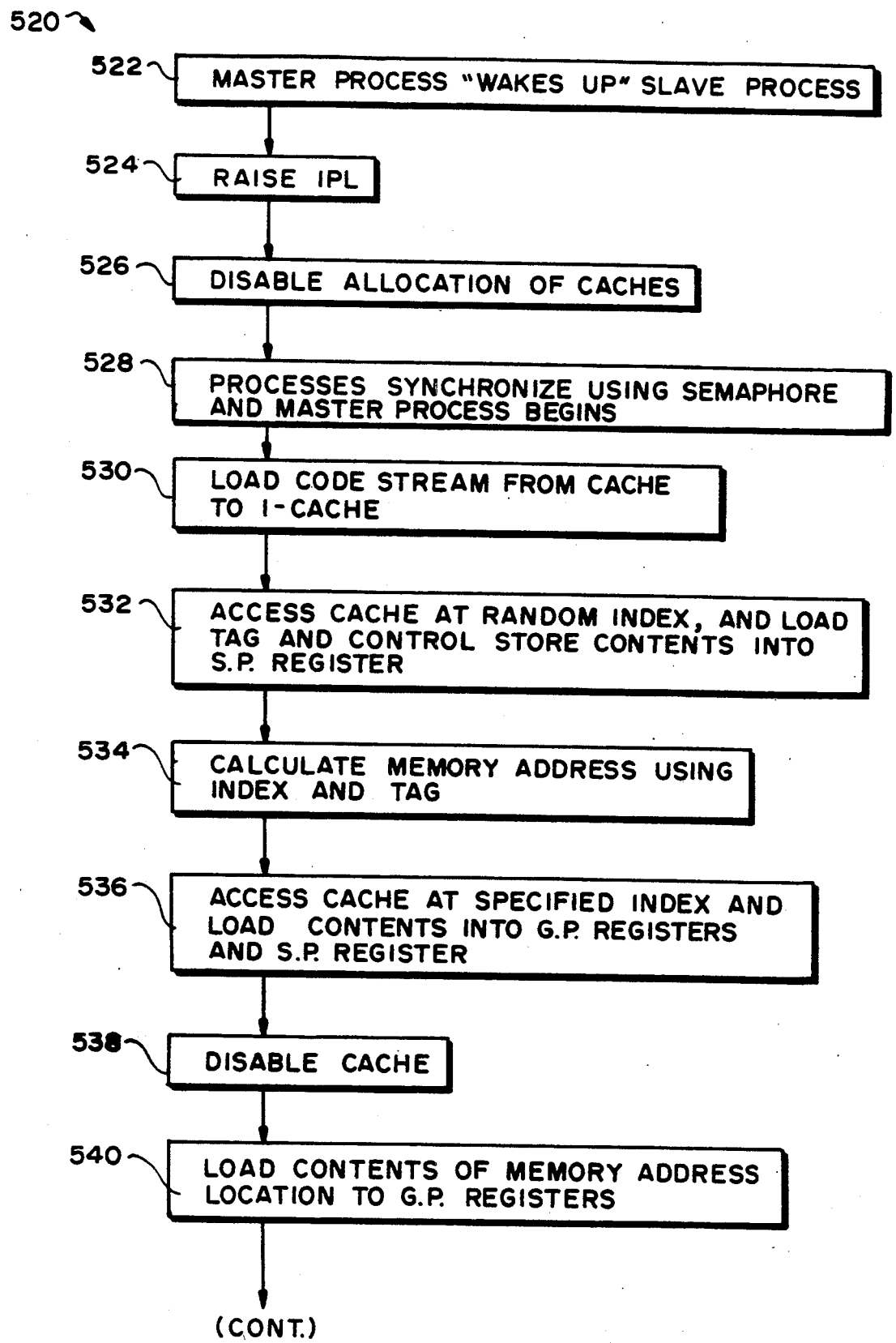
FIGS. 5A–B are flow diagrams of a master and slave process used to implement a cache examining protocol in accordance with the invention.
Figure 5B:
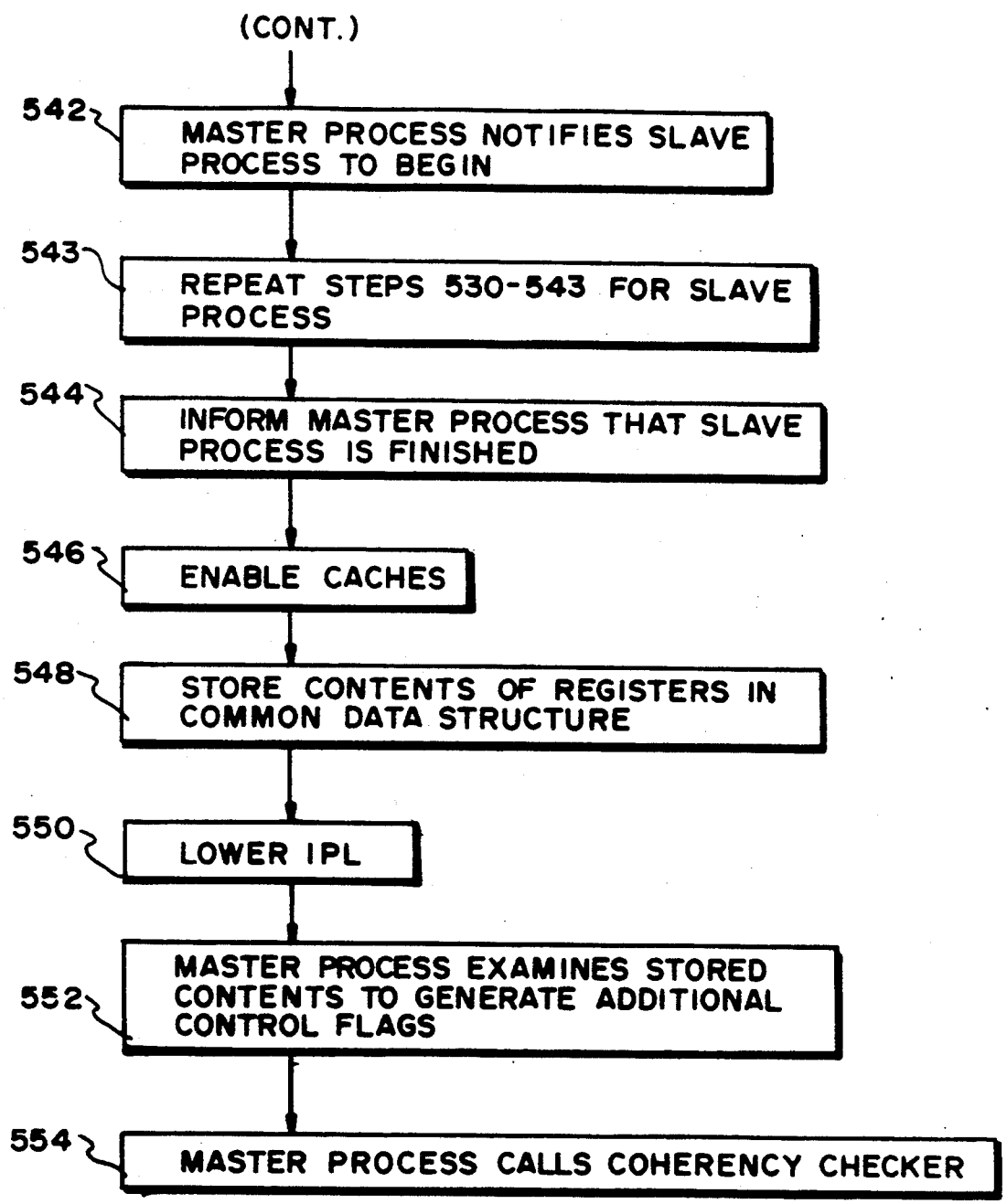

FIGS. 5A–B are flow diagrams 520 of the master process 510 and slave process 515 used to test the cache control logic 25 in accordance with the cache examining and coherency protocol. Initially, the master process 510 "wakes-up" the slave process 515 using a scheduler module 120 (FIG. 1) of the operating system 15. (Step 522). In an embodiment of the invention, the scheduler may synchronize the processes by writing to a shared location in main memory. Both processes then raise the interrupt priority levels (IPL) at which software or hardware interrupts are generated (Step 524), thereby precluding interruption at the raised IPL value (or lower) during execution of the protocol. This synchronization technique ensures that the processes are not interrupted during execution of the protocol.

Next, the master and slave processes disable allocation of address locations in their caches 20m,s (Step 526) and thereafter engage a semaphore to ensure they are precluded from simultaneously accessing their caches during execution of the protocol. (Step 528). Limiting accesses to the caches is significant because it is possible that each CPU may address a similar cache index location and attempt to simultaneously access shared data contained therein. An interprocessor register 150 (FIG. 1) is the semaphore preferably used to synchronize the processes, thereby enabling the master process 510 to begin acquiring its information while the slave process 515 waits.

The master CPU 12m executes a routine to fetch a code instruction stream from the cache 20 and load it into the I-cache 13m. (Step 530). The CPU 12m accesses its cache 20m at a random index address and executes a load instruction from that index to a special-purpose register 27. (Step 532). This instruction causes the contents of the tag store and control store at that index to be loaded into a special-purpose "tag" register 27m. At this point, it is undetermined whether the contents of the block came from the cache 20 or the main memory 18 because the access was to a random index and, accordingly, the corresponding h-bit 31 is unasserted. The master CPU 12m uses the index and the tag addresses to calculate the associated main memory address. (Step 534).

The master CPU 12m then accesses its cache 20m a second time at this specified index and executes another load instruction that loads the contents of the data store at that index into the general-purpose registers 28m, while once again loading the contents of the tag store and control store into the tag register 27m. (Step 536). This time, the h-bit 31 is asserted, indicating that the information came from the cache 20. The cache 20m is then completely disabled (Step 538) and a load instruction is executed, loading the contents at the main memory address to the general-purpose registers 28m. (Step 540). Because the cache is disabled, it is assured that the information is loaded from main memory 18.

The interprocessor register 150 is then used to notify the slave process 515 that its CPU 12s can begin acquring information. (Step 542). The slave process (and CPU 12s) perform the same procedures set forth in Steps 530–540 so that the contents at the specified index and at the associated main memory location are loaded into registers of the slave CPU 12s. (Step 543.) Upon acquiring all its information, the slave process 515 writes a predetermined value to the interprocessor register 150, informing the master process 510 that it is finished. (Step 544). The master and slave processes then enable their caches (Step 546) and store the contents of their registers into the common data structure (CDS) 600 in main memory 18. (Step 548). It should also be noted that the information is not stored in the common data structure 600 until all of the information is acquired by the processes so that the states of the caches may be preserved during the acquisition period. Each process then lowers its IPL level. (Step 550.)

Thereafter, the master process 510 compares the contents of each cache entry with the contents of its associated memory location to determine whether the contents are equal. The results are reflected in additional control flags (Step 552), such as cm-flags 65 for the cache blocks. In addition, the contents of the master and slave cache blocks are compared, as are the values of their tags, and the results are reflected in the cc-flags 66 and the te-flags 67 for those cache blocks. The cm-flag, the cc-flag and the te-flag are then appended to the h-flag 61, the s-flag 62, the v-flag 63 and the d-flag 64 in the CDS 600 to form "cache state" information for a particular cache block entry, an example of which is set forth in FIG. 6. The master process 510 then calls the coherency checker 700. (Step 554).

Figure 6:
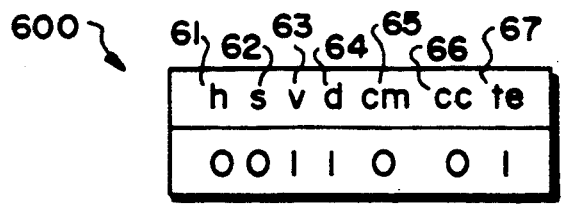
FIG. 6 is a diagram of a common data structure used to store information acquired by the master and slave processes.

The common data structure (CDS 600), shown in FIG. 6, serves as a repository for the information acquired by the master and slave processes. Preferably, the CDS 600 is a contiguous segment of main memory 18 organized as, e.g., an array. In an embodiment of the invention, there may be two separate arrays, one for each process in the system 10.

The coherency checker 700 (FIG. 1) is another scheduable entity consisting of software routines used to perform the cache coherency examination in accordance with the cache examining protocol of the invention. The primary functions of the coherency checker 700 are to derive a bit index from the cache state information stored in the CDS 600 and use that bit index as a pointer to a position of the bit vector. Thereafter, the coherency checker tests the value of that position to detect the state of the selected cache block entry.

Figure 7:
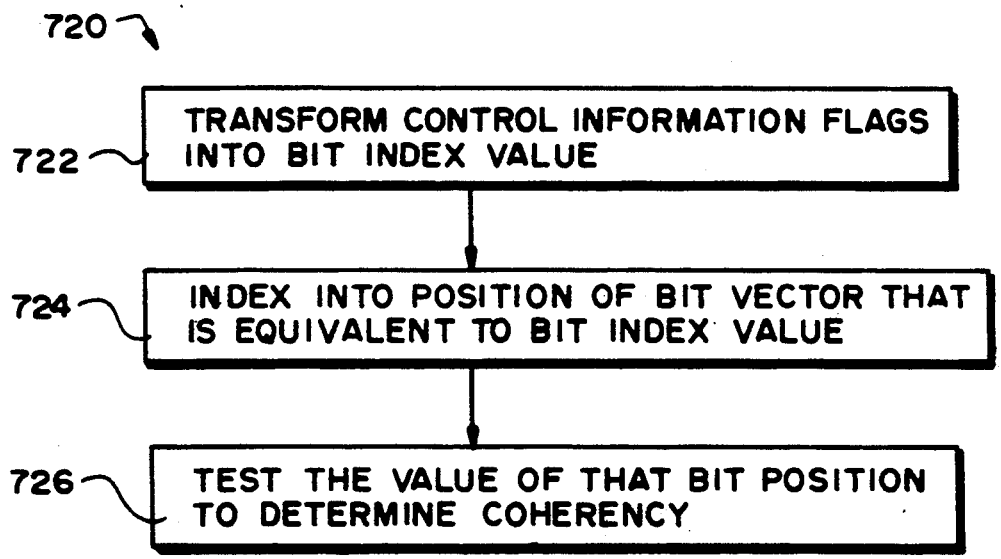
FIG. 7 is a flow diagram of the coherency checker process used to perform a cache coherency examination in accordance with the cache examining protocol the invention.
Figure 8:
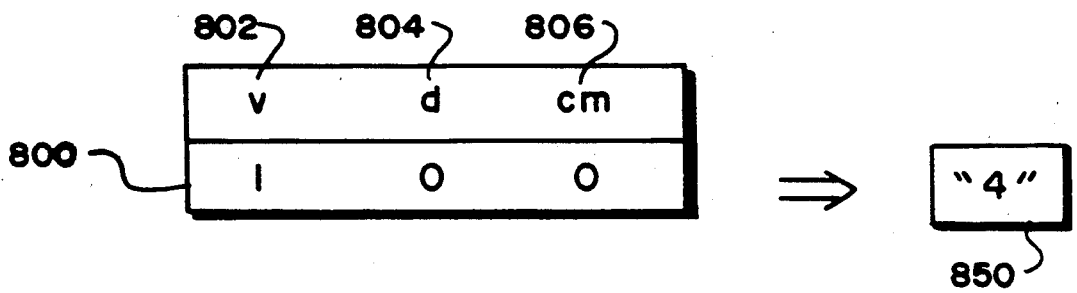
FIG. 8 illustrates a simplified cache block entry and derived bit index used to describe the operation of the coherency checker process in accordance with the invention.

FIG. 7 is a flow diagram 720 setting forth the operations of the coherency checker process 700. These operations will be described in connection with FIG. 8, which illustrates a simplified cache block entry 800 of the CDS 600 and a derived bit index 850. The simplified cache block entry 800 comprises a combination of the three (3) flag states depicted in the state table 400 of FIGS. 4A–B; namely, the v-flag 802, the d-flag 804 and the cm-flag 806.

The coherency checker 700 transforms the cache state information combination "1 0 0" of the entry 800 into the bit index 850. (Step 722). The bit index 850 is the decimal equivalent of the binary representation of those flags which, for this example, is the decimal "4". As noted, the bit index 850 functions as a pointer into the bit vector 450; accordingly, the coherency checker 700 indexes to bit position "4" of the bit vector (Step 724) and tests the value of that bit position to determine coherency. (Step 726). Using the bit vector 450 of FIG. 4B, bit position 4 has a value equal to "0", thereby indicating an invalid cache state for that cache block.

While there has been shown and described an illustrative embodiment by which CPUs of a multiprocessor RISC system may test the control logic of their caches, it is to be understood that various other adaptations and modifications may be made within the spirit and scope of the invention. For example, the invention is applicable to a uniprocessor RISC system having a single cache. In accordance with this embodiment of the invention, only the master process is needed to acquire information from the cache, thus obviating the techniques described herein for synchronizing with the slave processes.

The foregoing description has been limited to a specific embodiment of this invention. It will be apparent, however, that variations and modifications may be made to the invention, with the attainment of some or all of its advantages. Therefore, it is the object of the appended claims to cover all such variations and modifications as come within the true spirit and scope of the invention.

What is claimed is:

1. A method for testing control logic of caches to detect invalid cache states in a multiprocessor system having a main memory coupled to a plurality of processor associated with a plurality of caches, each of said caches having a plurality of blocks, said control logic configured to examine states of control store flags contained in a selected block, said method comprising the steps of:

acquiring information from said selected block of said caches and from a location in the main memory corresponding to said selected block, the information including said control store flags of said selected block;

generating additional flags from the information acquired from said caches, said additional flags indicating the state of said caches relative to each other and to the main memory;

deriving a bit index from said control store flags and said additional flags, said bit index having a value corresponding to a value of the control store flags and additional flags;

creating a bit vector from an array of valid cache states of said system, said valid cache states contained in a state table, said bit vector having a plurality of bit positions and a value associated with each position; and indexing into said bit vector in response to said bit index to test said bit position value of said bit vector, thereby detecting invalid cache states of said system.

2. The method of claim 1 further comprising the step of storing the information acquired from said caches and main memory in a common data structure of the main memory.

3. The method of claim 2 further comprising the step of storing said state table in a location in main memory.

4. A method for determining coherency of caches in a multiprocessor system having a main memory coupled to a plurality of processors, each processor associated with a respective one of said caches, each of said caches including control logic, each of said caches having a plurality of blocks, said control logic configured to examine states of control store flags contained in a selected block, said method comprising the steps of:

acquiring information from said selected block of a first cache associated with a first processor of said system;

acquiring information from said selected block of a second cache associated with a second processor of the system;

storing the information acquired from said caches in a shared location of said main memory, the information including said control store flags of said selected block;

generating additional flags from the information acquired from said caches, said additional flags indicating the state of said caches relative to each other and to said main memory;

deriving a bit index from said control store flags and said additional flags, said bit index having a decimal value associated therewith;

storing an array of cache states for said system in a state table located said main memory, each of said cache states having a value associated therewith;

creating a bit vector from said array of cache states, said bit vector having a plurality of bit positions and a value associated with each position; and indexing into said bit vector with said bit index to test said bit position value of said bit vector to determine coherency.

5. Apparatus for testing control logic of caches to detect invalid cache states in a multiprocessor system having a main memory coupled to a plurality of processors associated with a plurality of caches, each of said caches having a plurality of blocks, said control logic configured to examine states of control store flags contained in a selected block, said apparatus comprising:

means for acquiring information from said selected block of said caches and from a location in the main memory corresponding to said selected block, the information including said control store flags of said selected block;

means, coupled to said acquiring means, for generating additional flags from the information acquired from said caches, said additional flags indicating the state of said caches relative to each other and to the main memory;

means for deriving a bit index from said control store flags and said additional flags, said bit index having a decimal value associated therewith;

means, coupled to said generating means, for creating a bit vector from an array of valid cache states of said system contained in a state table, said bit vector having a plurality of bit positions and a value associated with each position; and means, coupled to said deriving means, for indexing into said bit vector using said bit index to test said bit position value of said bit vector, thereby detecting invalid cache states of said system.

6. The apparatus of claim 5 further comprising means for storing the information acquired from said caches and main memory in a shared location of the main memory.

* * * * *